(12) United States Patent
Duggal et al.

(10) Patent No.: US 6,357,889 B1
(45) Date of Patent: Mar. 19, 2002

(54) COLOR TUNABLE LIGHT SOURCE

(75) Inventors: Anil R. Duggal; Alok M. Srivastava, both of Niskayuna; Lionel M. Levinson, Schenectady; Steven J. Duclos, Clifton Park, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/452,554

(22) Filed: Dec. 1, 1999

(51) Int. Cl.$^7$ ............................................... H05B 43/00
(52) U.S. Cl. .................. 362/84; 362/230; 362/231; 362/235; 362/260; 362/293; 362/542; 362/249; 313/512
(58) Field of Search ................................ 362/230, 231, 362/84, 260, 293, 235, 800, 249; 40/542, 543; 313/483, 485, 486, 113, 512

(56) References Cited

U.S. PATENT DOCUMENTS

| 5,317,348 A | 5/1994 | Knize |
| 5,351,255 A | 9/1994 | Schetzina |
| 5,614,961 A | 3/1997 | Gibeau et al. |
| 5,700,076 A | 12/1997 | Minich et al. |
| 5,715,021 A | 2/1998 | Gibeau et al. |
| 5,792,509 A | 8/1998 | Lin et al. |
| 5,793,911 A | 8/1998 | Foley |
| 5,813,752 A | 9/1998 | Singer et al. |
| 5,813,753 A | * 9/1998 | Vriens et al. ............... 362/293 |
| 6,031,343 A | 2/2000 | Recknagel et al. |
| 6,046,720 A | 4/2000 | Melville et al. |
| 6,068,383 A | * 5/2000 | Robertson et al. ............ 362/84 |
| 6,149,283 A | * 11/2000 | Conway et al. ............. 362/236 |
| 6,234,648 B1 | * 5/2001 | Borner et al. ............... 362/235 |

FOREIGN PATENT DOCUMENTS

| DE | 19539592 | 5/1996 |
| EP | 0 936 682 A1 | 8/1999 |
| JP | 4163972 A | 6/1992 |
| JP | 4163973 A | 6/1992 |
| WO | WO 9520811 A | 8/1995 |
| WO | WO 97/48138 | 12/1997 |

* cited by examiner

Primary Examiner—Stephen Husar
Assistant Examiner—Anabel Ton
(74) Attorney, Agent, or Firm—Fay, Sharpe, Fagan, Minnich & Mckee, LLP (57) ABSTRACT

A color tunable light source (10) includes multiple light emitting components (32, 34, 36), such as light emitting diodes (LEDs) or laser diodes (LDs) with different emission wavelengths, and multiple phosphors (24) with different excitation and emission wavelengths. The emission wavelengths of the different light emitting components are chosen to match the excitation wavelengths of the different phosphors. The light emitting components are powered by an electrical circuit (42, 44, 46), which allows separate control of the optical power output of the different wavelength LEDs/LDs. The light from the light emitting components is arranged to impinge on the combination of phosphors such that the phosphors are excited and emit light at their characteristic wavelengths. By separately adjusting the power to each LED/LD, the amount of light emitted by each phosphor, and hence, through color mixing, the color of the light emitted, is varied.

22 Claims, 5 Drawing Sheets

COLOR TUNABLE LIGHT SOURCE

BACKGROUND OF THE INVENTION

This invention relates to the illumination arts. More particularly, this invention relates to a color-tunable lighting system incorporating a plurality of phosphors and light emitting diodes (LEDs) or laser diodes (LDs) which is capable of producing visible light of different color temperatures.

Light emitting diodes and lasers have been produced from Group III-V alloys, such as gallium nitride (GaN)-based LEDs. To form the LEDs, layers of the GaN-based alloys are typically deposited epitaxially on a substrate, such as a silicon carbide or sapphire substrate, and may be doped with a variety of n and p-type dopants to improve properties, such as light emission efficiency. Such GaN-based LEDs generally emit light in the UV and blue range of the electromagnetic spectrum. As used herein, the term "UV/blue" LED or LD means an LED or laser diode emitting in the UV range, or in the blue range, or both the UV and the blue ranges of the electromagnetic spectrum.

Recently, techniques have been developed for converting the light emitted from LEDs to useful light for illumination purposes. By interposing a phosphor in the beam produced from a UV/blue LED, for example, light of longer wavelength, in the visible range of the spectrum (e.g., green, red, or white light), may be generated.

The wavelength of the light emitted by the phosphor is dependent on the particular phosphor material used. For example, a blue absorbing, yellow emitting phosphor, such as an yttrium-aluminum-gallium phosphor, commonly referred to as a YAG phosphor, can be used to generate yellow light. Examples of such phosphors include a $Y_3(Al/Ga)_5O_{12}$:Ce phosphor having a garnet structure, as disclosed in EP 0 936 682, to Nichia Chemical Ind. Light sources produced in this manner are suited to a wide variety of applications, including lamps, displays, back light sources, traffic signals, illuminating switches, and the like.

In some cases, it is desirable to change the color of light. For example, certain light tones are suited for working, yet are considered too harsh for other activities. At present, this need is satisfied with discharge-based fluorescent lights by changing the relative proportions of phosphors in the phosphor coatings in order to attain a specified color coordinate. Thus, the light source is set at the factory to emit light of a particular wavelength or wavelengths and could not be adjusted by the consumer to emit light of a different tone. To change color temperature, the light source could be replaced by one of a different tone. This is time consuming and not practical for changing the tone at frequent intervals. Alternatively, one light could be switched off and another switched on. This option is not practical for most purposes, since multiple lights and electrical connections are required.

The present invention provides a new and improved color tunable light source and method of use, which overcomes the above-referenced problems and others.

SUMMARY OF THE INVENTION

In an exemplary embodiment of the present invention, a light source is provided. The light source includes a first light emitting component, which emits light at a first wavelength, a second light emitting component, which emits light at a second wavelength different from that of the first wavelength, and phosphors positioned to receive the light emitted by the first and second light emitting components. The phosphors include a first phosphor which is capable of absorbing a part of the light from the first light emitting component and emitting light of a third wavelength, and a second phosphor which is capable of absorbing a part of the light from the second light emitting component and emitting light of a fourth wavelength. The second phosphor is excited relatively less by light of the first wavelength than by light of the second wavelength.

In another exemplary embodiment of the present invention, a method of changing the color of light is provided. The method includes providing first and second light emitting component which emit light of first and second wavelengths, a first phosphor which is capable of absorbing a part of the light from the first light emitting component and emitting light of a longer wavelength, and a second phosphor which is capable of absorbing a part of the light from the second light emitting component and emitting light of a longer wavelength different from the wavelength of the light emitted by the first phosphor. The second phosphor is relatively less affected by light of the first wavelength than by light of the second wavelength. The method further includes adjusting power supplied to at least one of the first and second light emitting components separately from the other of the first and second light emitting components such that the amount of light emitted by the at least one the first and second light emitting components is adjusted. Further, the method includes combining the light emitted by the first phosphor and the second phosphor.

One advantage of the present invention is the provision of a light source which is tunable to more than one color for mood or for functional purposes.

Another advantage of the present invention is that the light emitted by the light source is infinitely variable over a range of wavelengths.

Another advantage of the present invention is that it enables the light source to be adjusted to an optimum color for performing a particular activity.

Another advantage of the present invention is that it enables a single manufacturing process to be used to produce lamps which are then utilized in a variety of potential markets.

Still further advantages of the present invention will become apparent to those of ordinary skill in the art upon reading and understanding the following detailed description of the preferred embodiments.

BRIEF DESCRIPTION OF THE DRAWINGS

FIG. 7 is a plot of intensity vs. wavelength for three different color temperatures: FIG. 7A, 4000K, FIG. 7B, 5000K, and FIG. 7C, 6000K, according to the present invention.

DESCRIPTION OF THE PREFERRED EMBODIMENTS

Figure 1:
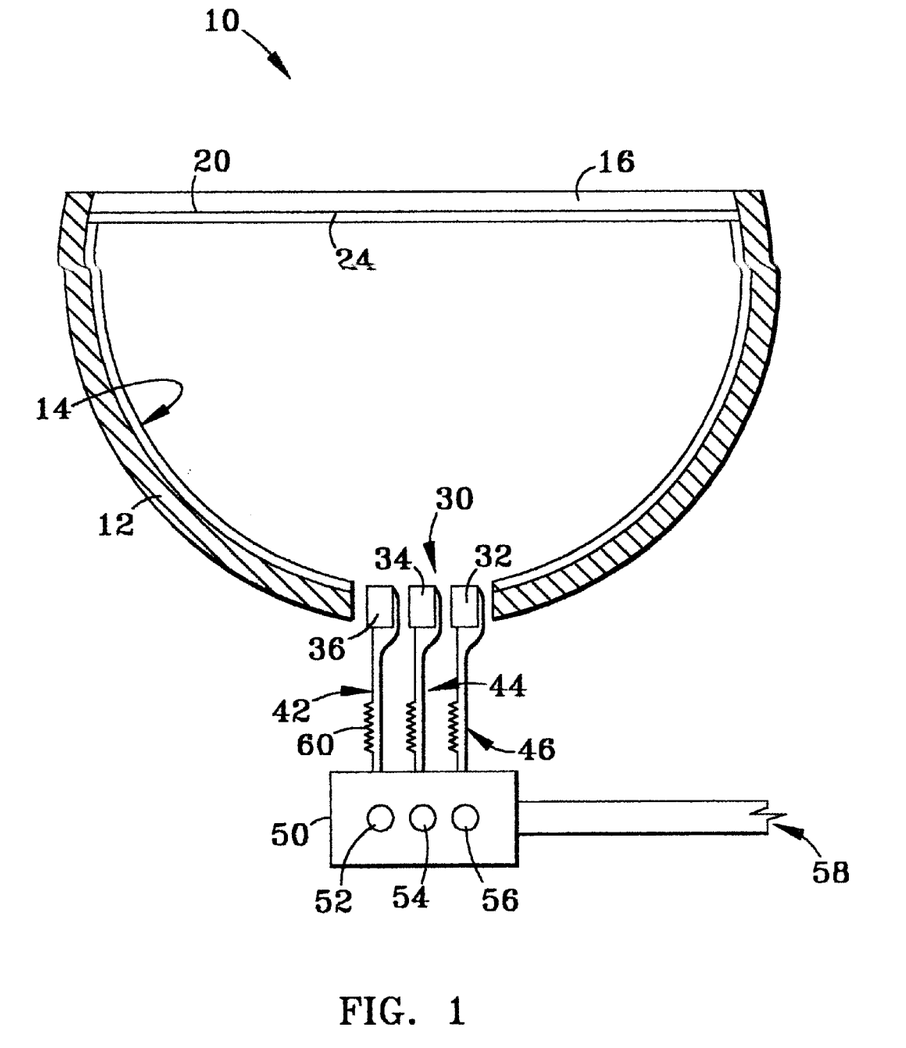
FIG. 1 is a side sectional view of a light source according to the present invention.

With reference to FIG. 1, a light source, such as a lamp 10 includes a reflector housing 12 in the shape of a cup, which is coated on its interior surface with a reflective coating 14 capable of reflecting light in the UV and visible range of the electromagnetic spectrum. The reflector housing may have a variety of configurations for reflecting light as a beam, or for providing more diffuse light. A light transmissive plate 16 covers an open end of the housing. The plate may be a lens, for focussing light emitted form the housing, or a sheet of light transmissive material, such as glass, plastic, or the like.

One surface of the plate, preferably the interior surface 20, is coated with a fluorescent material, such as a phosphor coating 24. The fluorescent material includes two or more different phosphors. For convenience, the term phosphor will be used to include all types of fluorescent suited to the present invention. The phosphor coating 24 includes two or more different phosphors, which are preferably mixed together in the coating. Alternatively, the different phosphors are layered in the coating.

A bank 30 of multiple light-emitting components 32, 34, 36, such as light emitting diodes LEDs or laser diodes LDs, is positioned at the base of the housing 12. FIG. 1, shows three LEDs/LDs positioned in the housing. It is also contemplated that there be only two light emitting components, or more than three light emitting components. Light is emitted by the LEDs/LDs 32, 34, 36 into the housing and may be reflected from the reflective coating 14. The light impinges on the phosphors, which convert all or a portion of the emitted light from the LEDs to longer wavelengths, preferably in the visible range.

The phosphors that comprise the coating 24 are substances which are capable of absorbing a part of the light emitted by one or all of the light emitting components 30 and emitting light of a wavelength different from that of the absorbed light.

The bank 30 of light emitting components includes LEDs/LDS with different emission wavelengths. In general, the wavelength of light emitted by an LED/LD is dependent on the configuration of the semiconductor layers employed in forming the LED/LD. As is known in the art, the composition of the semiconductor layers and the dopants employed can be selected so as to produce LEDs which differ from each other in their emission wavelengths. At least two light emitting components of different emission wavelengths are employed. Specifically, the two (or more) LEDs or LDs each have an emission spectrum with a peak at a particular wavelength, which differs from the peak of the other LD/LED's emission spectrum. For example, one LED emits at around 370 nm while another LED emits at around 450 nm. More than one LED/LD may be provided for each of the selected wavelengths to increase the intensity of the emitted light. This is particularly preferred when LEDs rather than LDs are used, as the emission from a single LED is generally less than that of an LD.

Figure 2:
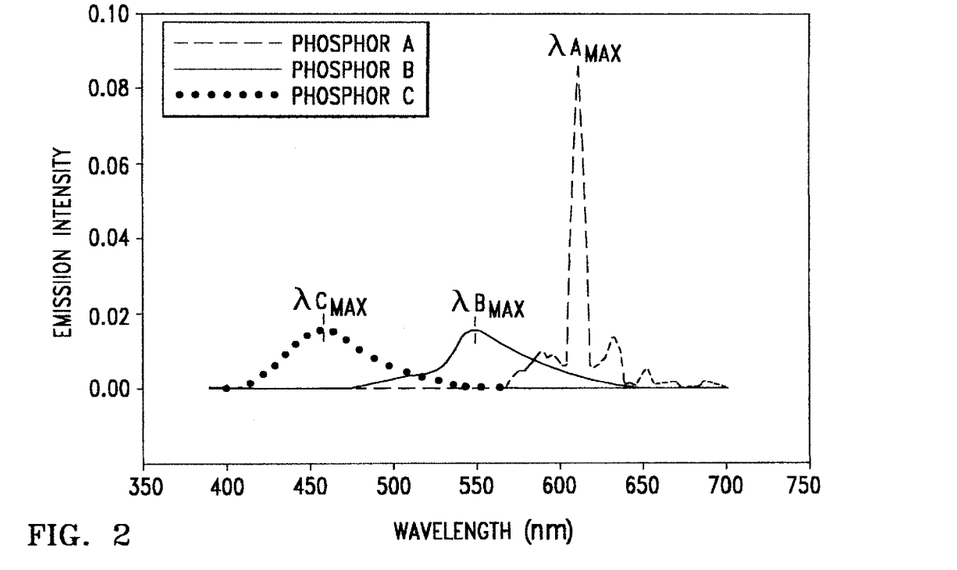
FIG. 2 is an emission intensity spectrum for three phosphors, A, B, and C, according to the present invention.

Each of the phosphors in the coating emits light preferentially at a characteristic wavelength. By this it is meant that the peak emission for each of the two (or more) phosphors corresponds to a different part of the electromagnetic spectrum. As shown in FIG. 2, each phosphor A, B, and C, has an emission spectrum which has an approximately gaussian distribution, with a maximum at a particular wavelength $\lambda_{max}$. While the emission spectra of the three phosphors may overlap, as shown in FIG. 2, the $\lambda_{max}$ for each phosphor is sufficiently separate from that of the other phosphor that the light emitted is of two different colors. For example the emission wavelength of phosphor A, $\lambda_{max}$, may be in the red part of the spectrum and the emission wavelength of phosphor B, $\lambda_{max}$, may be in the yellow part of the spectrum, and so forth.

In addition to having different emission wavelengths, the two or more phosphors also have different excitation wavelengths. The excitation wavelength is the wavelength of light which causes the phosphor to emit light. For example, phosphor A may have an excitation wavelength of 370 nm and phosphor B an excitation wavelength of 450 nm. Thus, phosphor A will only emit light when excited by light of around 370 nm, while phosphor B will only emit light when excited by light of around 450 nm. Or, phosphor A may respond to both the 370 and the 450 nm wavelengths while phosphor B responds to only the 370 nm excitation wavelength.

Figure 3:
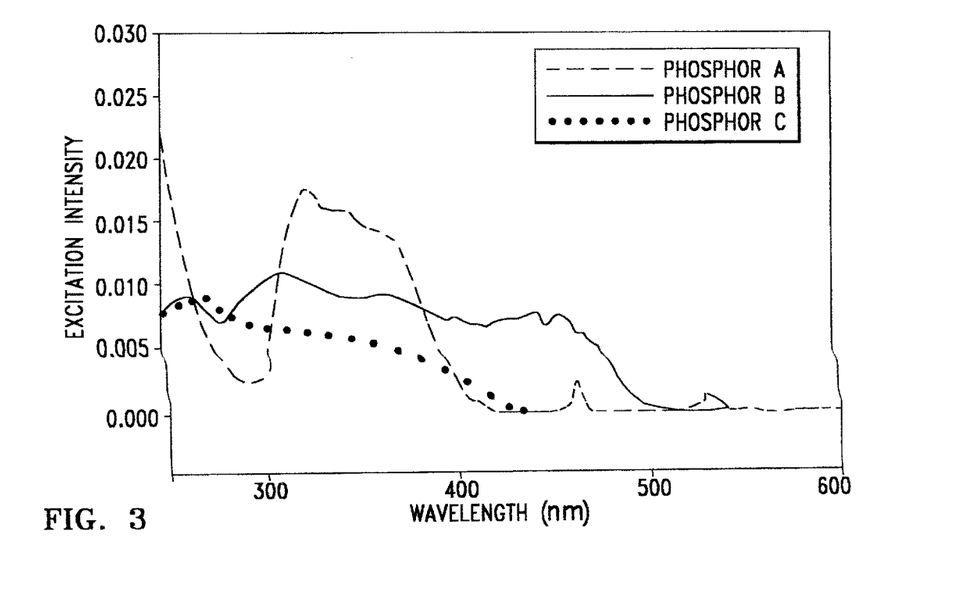
FIG. 3 is an excitation intensity spectrum for the three phosphors of FIG. 2.

In another example, shown in FIG. 3, each of three phosphors, A, B, and C responds to wavelengths in the 300–400 nm range, while only phosphor B responds significantly to light in the 400–500 nm range.

The light emitted from the phosphors combines to form a mixture of the various emitted wavelengths. Obviously, a variety of combinations of light emitting components and phosphors having different emission and excitation wavelengths can be used to achieve a variety of color ranges.

The emission wavelength of each of the different light emitting components is chosen to match the excitation wavelengths of at least one of the different phosphors. Thus, each of the phosphors is excited by the output wavelength of at least one of the light emitting components, and may be excited by all of the LED/LD output wavelengths. However, there is, preferably, at least one phosphor in the coating that is not fully excited by at least one of the LED/LD output wavelengths. Similarly, each of the light emitting components excites at least one of the phosphors, and may excite all of the phosphors, but, preferably, at least one LD/LED does not fully excite all of the phosphors. For example, in the embodiment shown in FIG. 1, LEDs 32, 34, and 36 may all excite three phosphors A, B, and C in the phosphor coating 24, but LED 32 excites phosphor A by a relatively larger amount than LEDs 34 and/or 36, and excites phosphors B and/or C by a relatively smaller amount than LEDs 34 and/or 36, and so forth. Thus, when power to LED 32 is reduced, the color of the light emitted has a lesser contribution from phosphor A and the color of the light is shifted to that emitted from phosphors B and/or C.

With reference once more to FIG. 1, in one embodiment, each of the LEDs/LDs 32, 34, 36 is separately controllable by adjusting the power supplied to each of the LEDs/LDs. Each LED/LD has a separate electrical circuit 42, 44, 46, respectively. Where more than one LED/LD of a particular emission wavelength is used, these may be powered as a bank. The amount of light emitted by an LED/LD increases as the current flowing through the circuit is increased. This allows the emission of each LED/LD (or LED/LD type) to be separately controlled. As shown in FIG. 1, a controller 50 has controls 52, 54, and 56 for separately controlling the power supplied to each of the three light emitting components circuits 42, 44, 44 from an external source of power, such as a mains power supply 58. The controls 52, 54, and 56 may be infinitely variable, for example by employing a rheostat 60 in each circuit, or may be adjustable step-wise, such that the operator has a choice of two or more settings for each LED/LD. As well as controlling the color of the emitted light, the intensity of the emitted light may also be varied by adjusting the total power supplied to the bank of LEDs/LDS.

Figure 4:
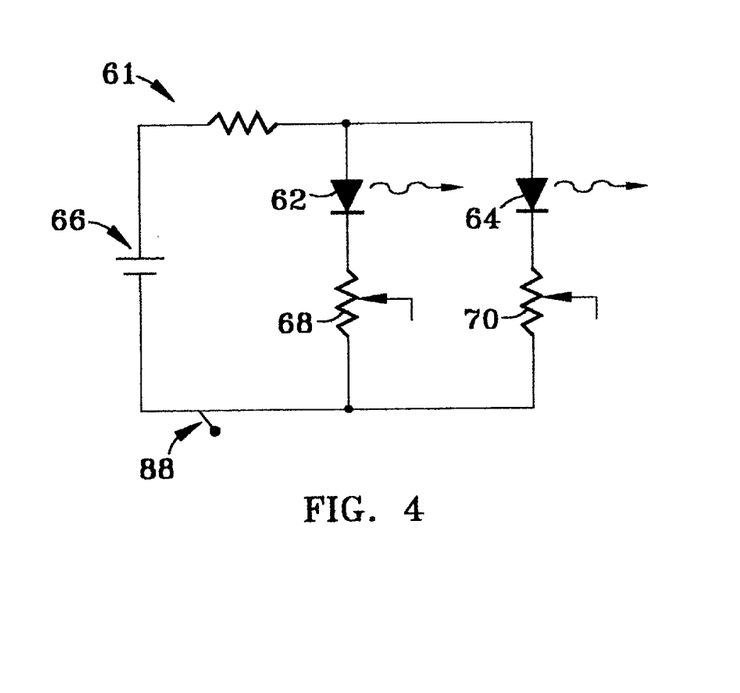
FIG. 4 is an electrical circuit diagram of a control system for two light emitting components, according to the present invention.

An alternative, electrical circuit 61 for two LEDs or LDs 62, 64 is shown is shown in FIG. 4. A source of power 66 is connected in parallel with the LDs/LEDs. Rheostat controls 68, 70 control the amount of power received by each of the two LDs/LEDs.

Figure 5:
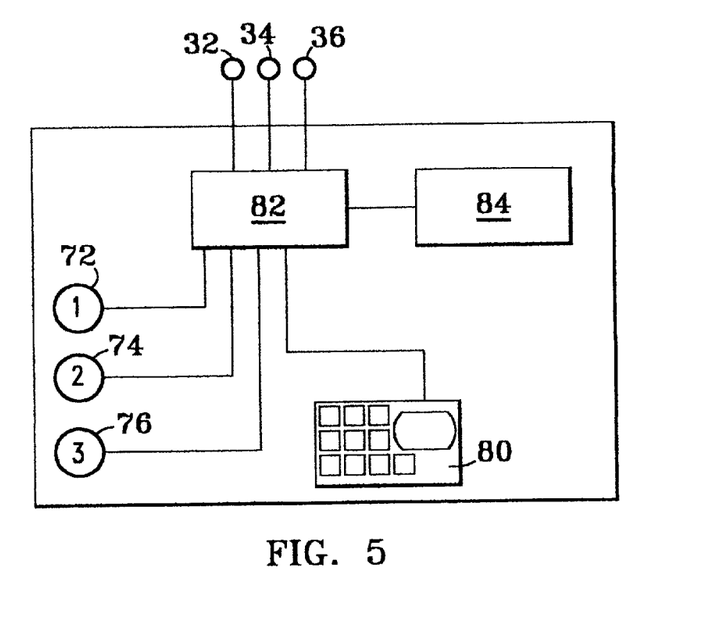
FIG. 5 is a schematic diagram of a control system for three light emitting components, according to an alternative embodiment of the present invention.

A variety of other control systems are also contemplated. For example, as shown in FIG. 5, the operator selects a color of light by pressing a switch 72, 74, or 76, corresponding to a preselected light color or by entering a number on a keypad 80. A control system 82 accesses a look up table which shows how much power should be supplied to each LED/LD 32, 34, 36 to provide the color selected. The control system then adjusts the power supplied to each LED/LD accordingly. For example, switch 72 may correspond to light which approximates white light, but has a slightly blue tone suited for work environments, while switches 74, and 76 may correspond to light of a slightly yellow or red hue, respectively. The keypad 80 provides finer adjustments of the color. For, example, by selecting a number from 1 to 100, the operator selects one of a hundred incrementally changing light colors.

In another embodiment, power to one or more of the light emitting components (e.g., LEDs/LDs 32 and 34 in FIG. 1) is not adjustable by the operator. Instead, these light emitting components are powered whenever the light source is switched on. The non-adjustable light emitting components excite at least one but not all of the phosphors. The non-adjustable light emitting components 32, 34 are used provide the basic light color of the lamp. A single switch is used to adjust the power supplied to an adjustable LED/LD (e.g., LED/LD 36) to fine tune the overall color of the light source. The adjustable LED/LD excites the phosphor not excited by the remaining light emitting components, although it may also excite other of the phosphors.

In the circuit of FIG. 4, for example, one of the rheostats may be eliminated. For example, rheostat 68 is eliminated and LED/LD 62 receives power whenever a switch 88 is switched on. Variation in the color temperature is then achieved by adjusting the rheostat 70.

A variety of phosphors may be used in the present invention. Examples of phosphors which may be utilized include:

$BaMg_2Al_{16}O_{27}$: $Eu^{2+}$— a blue emitter
$Ca_8Mg(SiO_4)_4Cl_2$: $Eu^{2+}$, $Mn^{2+}$— a green emitter
$Y_2O_3$: $Bi^{3+}$, $Eu^{2+}$— a red emitter In the description of phosphors, a conventional notation is used, wherein the chemical formula for a host or matrix compound is given first, followed by a colon and the formula for an activator (an impurity that activates the host crystal to luminesce). For example, in the case of the blue emitter above, $BaMg_2Al_{16}O_{27}$ is the host and $Eu^{2+}$ is the activator.

The phosphors are preferably combined with at least two separately controllable LDs/LEDs from the GaN semiconductor material system. For example, one light emitting component emits at 370 nm (i.e., has an emission spectrum with a peak at 370 nm) and one emits at 450 nm (i.e., has an emission spectrum with a peak at 450 nm). The three phosphors listed above all emit light with 370 nm excitation, but only the red emitter emits light with 450 nm excitation. This allows the light source to emit a specific color of white light through excitation of the phosphors with light emitted by the 370 nm LED/LD. This color is tuned to more or less red by separately controlling the output of the 450 nm LED.

Other phosphors which may be utilized, in a wide range of combinations, include cerium activated phosphors of garnet-based fluorophors containing at least one element selected from the group consisting of Y, Lu, Sc, La, Gd, and Sm and at least one element selected from Al, Ga, and In. Examples of this type of phosphor include $Y_3Al_5O_{12}$:Ce. Such phosphors are disclosed in EP Patent Application EP 0 936 682 A1 to Nichia Chemical Industries, Ltd. Other suitable phosphors include $Y_2O_2S$:Eu (a red emitter); and ZnS:Cu, Ag (a green emitter).

Phosphors to be used in the light source 10 preferably have the following attributes:

1. Light resistance. Ideally, the phosphor is one which has a good resistance to light so that its fluorescent properties are not degraded when used over an extended period of time.
2. Capability of emitting light with a high efficiency.
3. Temperature resistance, if located in the vicinity of the LED/LEDs.
4. Weatherability in the operating environment of the light source.

The phosphors may be mixed together in a single layer, or separately layered to form a multi-layer coating on the transparent plate 16. Other arrangements are also contemplated. For example, the phosphors may be arranged in different regions and the light emitted from each region combined to form the resulting output.

Light emitting components 32, 34, 36 suited to use in the present invention preferably include GaN-based (InAlGaN) semiconductor devices. Suitable GaN semiconductor materials for forming the light emitting components are generally represented by the general formula $In_iGa_jAl_kN$, where $0 \leq i$, $0 \leq j$, $0 \leq k$, and $i+j+k=1$. The nitride semiconductor materials may thus include materials such as InGaN and GaN, and may be doped with various impurities, for example, for improving the intensity or adjusting the color of the light emitted. Laser Diodes are similarly formed from an arrangement of GaN layers. Techniques for forming LEDs and LDs are well known in the art.

Figure 6:
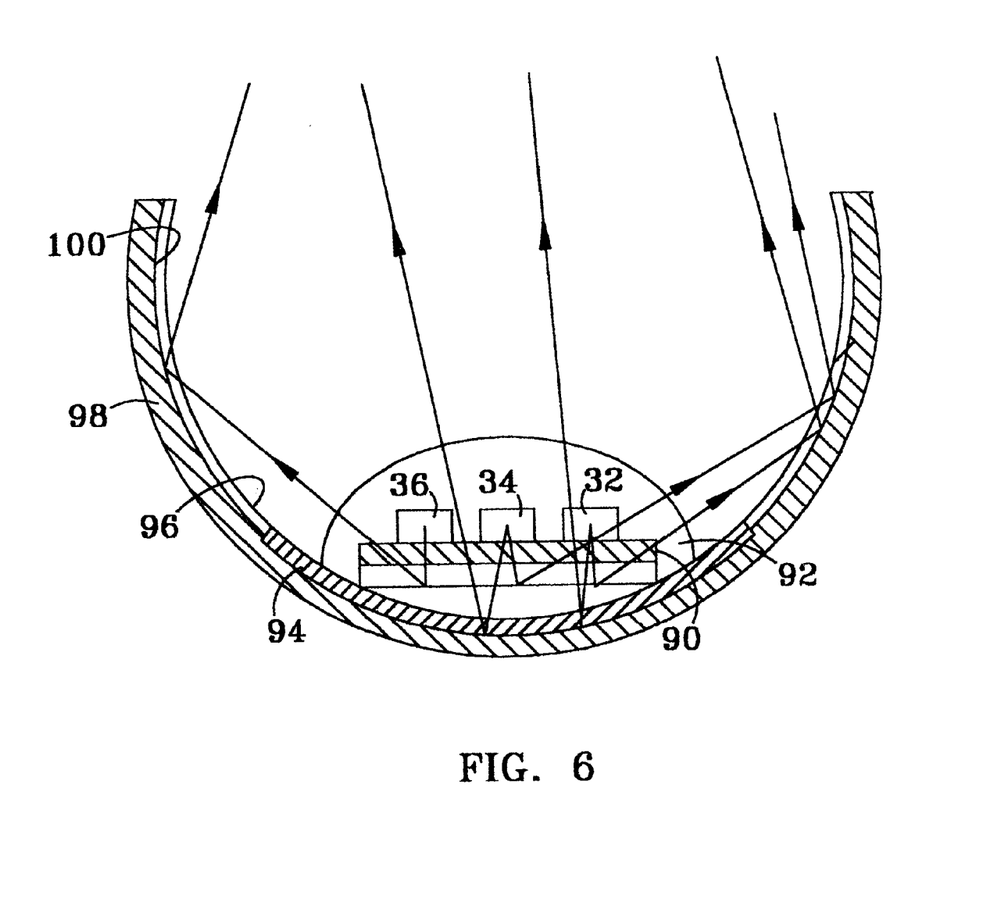
FIG. 6 is a is a side sectional view of a light source, showing rays of light as arrows, according to another embodiment of the present invention.

GaN-based light emitting devices are capable of emitting light with high luminance. A suitable GaN-based LED device includes a substrate layer formed from a single crystal of, for example, sapphire, silicon carbide, or zinc oxide. A epitaxial buffer layer, of, for example, $n^+$ GaN is located on the substrate, followed by a sequence of epitaxial layers comprising cladding layers and active layers. Electrical contact is made between two of the layers and corresponding voltage electrodes (through a metal contact layer) to connect the LED to the circuit and source of power. The light emitting components 30, 32, 34 may each have their own substrate or may be formed on a common substrate 90, as shown in FIG. 6. The LEDs/LDs are preferably protected by a resin mold 92, which may be formed from an epoxy, or other material, which transmits the light emitted from the light emitting components. The resin may encapsulate all of the light emitting components, as shown in FIG. 6, or may separately encapsulate each of the light emitting components.

While FIG. 1 shows the phosphor coating on a transparent plate, it should be appreciated that the phosphors may be disposed elsewhere in the light source. For example, the phosphors may be combined with the packaging resin 92 used to encapsulate the light emitting components. Alternatively, the light from the LDs/LEDS may be transmitted through the LED/LD substrate 90 onto a phosphor coated screen 94 as shown in FIG. 6. FIG. 6 shows the screen 94 formed on a portion of the interior surface 96 of a housing 98, although other locations for the screen are also contemplated. The light emitted by the phosphors is then reflected by a reflective surface 100 on the interior surface of the housing or another suitable reflective surface.

While the light source has been described in terms of a reflector housing, other arrangements which do not rely on a reflective surface are also contemplated. In one alternative embodiment, light emitted by the LEDs/LDs is transported by light pipes to the phosphor coating.

While not intending to limit the scope of the invention, the following example provides a theoretical analysis of the output from a light source comprising two light emitting components and three phosphors.

EXAMPLE

This example shows how two light emitting diodes (LEDs) or laser diodes (LDs) may be combined with three phosphors such that, by adjusting the relative power supplied to the two LEDs/LDs, the color temperature of white light is adjusted.

The optical spectrum $S_1(\lambda)$ resulting from exciting three phosphors with a first LED or LD, 1 is give by the following equation:

$$S_1(k) = M_A F_A(\lambda) + M_B F_B(\lambda) + M_C F_C(\lambda) \quad (1)$$

Where $\lambda$ is the optical wavelength, $F_i(\lambda)$ is the normalized spectral emission lineshape for phosphor i (where i is phosphor A, B, or C), and $M_i$ is an amplitude factor which is determined primarily by the relative amount of phosphor i in the phosphor mixture. Note that for this treatment, only the shape of $S_1(\lambda)$ is important so that the absolute amplitude does not matter. Thus, the amplitude factors can be arbitrarily normalized such that their sum equals 1. This treatment also assumes that all of the light emitted by LED/LD 1 is absorbed by the phosphors. (This is not necessary for the invention but simplifies the example.) A similar equation can be written resulting from exciting the three phosphors with LED/LD 2 as follows:

$$S_2(\lambda) = N_A F_A(\lambda) + N_B F_B(\lambda) + N_C F_C(\lambda) \quad (2)$$

Where $N_i$ is an amplitude factor which is determined primarily by the relative amount of phosphor i in the phosphor mixture. For a given phosphor mixture, the $M_i$ and $N_i$ are related by the relative amounts that phosphor is excited by LED/LD 1 and LED/LD 2. This can be written quantitatively as $$R_i = \frac{N_i}{M_i} = \frac{\int E_i(\lambda) L_N(\lambda) d\lambda}{\int E_i(\lambda) L_M(\lambda) d\lambda} \quad (3)$$

wherein Ri represents the relative excitation ratio, $E_i(\lambda)$ represents the normalized excitation spectrum of phosphor i and $L_1(\lambda)$ and $L_2(\lambda)$ represent the normalized emission spectrum of LED/LD 1 and 2, respectively. Note that this relationship assumes that second order effects such as phosphors reabsorbing light emitted by other phosphors can be ignored. Equation 3 also implicitly assumes that the emission spectra do not depend on the excitation wavelength. In general, these assumptions are not always true but these assumptions are made to make the example clearer.

The total spectrum of the device $S_{TOT}(\lambda)$ can be expressed in terms of the relative output power from LED 1 and 2 as follows:

$$S_{TOT}(\lambda) = P_1 S_1(\lambda) + P_2 S_2(\lambda) \quad (4)$$

Here, $P_1$ and $P_2$ represent the relative output power from LEDs/LDs 1 and 2 respectively. Given the total device spectrum, it is possible to calculate the color coordinates, color temperature, luminous efficacy (lumens per optical watt), and color rendition index (CRI) using methods known in the art (see, for example, Gunter Wyszecki and W. S. Stiles, *Color Science: Concepts and Methods, Quantitative Data and Formulae*, John Wiley & Sons, Inc. (1982).

An example device consists of two LEDs with output wavelengths of 370 nm (LED 1) and 400 nm (LED 2) combined with the three phosphors $Y_2O_3:Bi^{3+}$, $Eu^{2+}$ (YEO:Bi) (phosphor A); $Ca_8Mg(SiO_4)_4Cl_2:Eu^{2+}$, $Mn^{2+}$ (CaSi) (phosphor B); and $BaMg_2Al_{16}O_{27}:Eu^{2+}$(BAM) (phosphor C). The emission and excitation spectra for these phosphors are given in FIGS. 2 and 3. From the excitation spectra, the excitation ratios (Ri) are calculated, using Equation 3. For simplicity of calculation, Equation 3 can be approximated as:

$$R_i = \frac{N_i}{M_i} \cong \frac{E_i(400)}{E_i(370)} \quad (5)$$

This approximation assumes that the spectral linewidths of LEDs 1 and 2 are negligibly small. Values of $R_i$ calculated using the data in FIG. 3 are given in TABLE 1. TABLE 1 also gives a set of $M_i$ and $N_i$ values for the example device.

TABLE 1

|  | R | $M_i$ | $N_i$ |
| --- | --- | --- | --- |
| Phosphor A | 0.24 | 0.31 | 0.13 |
| Phosphor B | 0.85 | 0.36 | 0.51 |
| Phosphor C | 0.65 | 0.33 | 0.36 |

Figure 7A:
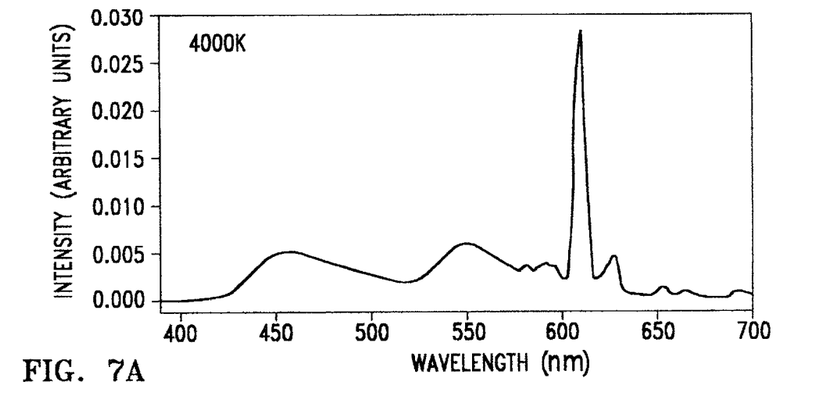
Figure 7B:
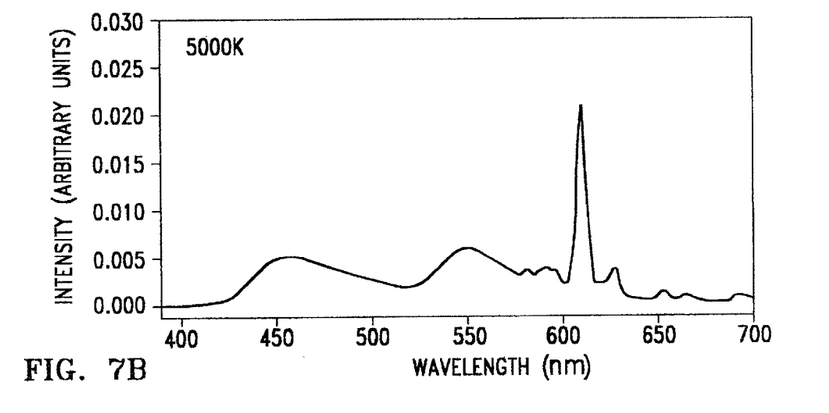
Figure 7C:
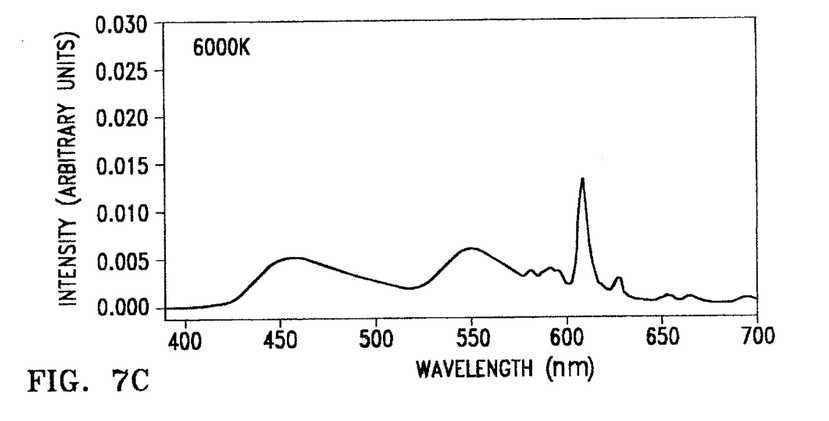

Note that the Ni values can be calculated from the $M_i$ values using equation 5 and the normalization condition that $N_1+N_2+N_3=1$. Given these values, it is possible to vary the relative output powers of LED 1 and LED 2 in order to vary the color temperature of the device. This is illustrated in TABLE 2 for three possible values for $P_1$ and $P_2$. The values in TABLE 2 were calculated by calculating the total device spectrum using the data in TABLE 1 and equations 1, 2, and 4 and then calculating the various color parameters using methods known in the art. FIG. 7 provides the optical spectra associated with the three device configurations depicted in TABLE 2. Note that these calculations are only approximate, due to the approximation leading to equation 5 and the fact that the possibility that phosphor B might reabsorb and then re-emit some of the light emitted by phosphor C has not been quantitatively accounted for.

TABLE 2

| $P_1$ | $P_2$ | X | Y | Correlated Color Temperature (K) | Luminous Efficacy (Lumens/ Optical watt) | Color Rendition Index |
| --- | --- | --- | --- | --- | --- | --- |
| 1 | 0 | 0.371 | 0.341 | 4000 | 324 | 89 |
| 0.41 | 0.59 | 0.345 | 0.355 | 5000 | 340 | 81 |
| 0.03 | 0.97 | 0.319 | 0.369 | 6000 | 355 | 67 |

X and Y are chromaticity coordinates on the CIE (Commission Internationale de l'Eclairage) scale. Any color can be represented on the X,Y chromaticity diagram.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A light source comprising:
a first light emitting component which emits light at a first wavelength;
a second light emitting component which emits light at a second wavelength different from that of the first wavelength; and
phosphors positioned to receive the light emitted by the first and second light emitting components, the phosphors including:
a first phosphor which absorbs a part of the light from the first light emitting component and emits light of a third wavelength, and
a second phosphor which absorbs a part of the light from the second light emitting component and emits light of a fourth wavelength, the second phosphor being excited relatively less by light of the first wavelength than by light of the second wavelength, such that when power supplied to at least one of the first and second light emitting components is varied, the color of light emitted by the light source is changed.

2. The light source of claim 1, wherein the first and second light emitting components are selected from the group consisting of light emitting diodes and laser diodes.

3. The light source of claim 1, wherein each of the first and second light emitting components includes a plurality of light emitting diodes.

4. The light source of claim 1, further including:
a controller for variably controlling power supplied to at least one of the first and second light emitting components separately from the other of the first and second light emitting components for varying the color of light emitted by the light source.

5. The light source of claim 4, wherein the power to both the first and the second light emitting components is separately variable.

6. The light source of claim 1, wherein the first phosphor is excited by light emitted by both the first and second light emitting components.

7. The light source of claim 1, wherein the first and second phosphors are selected from the group consisting of:
$BaMg_2Al_{16}O_{27}$:$Eu^{2+}$; $Ca_8Mg(SiO_4)_4Cl_2$:$Eu^{2+}$, $Mn^{2+}$; $Y_2O_3$:$Bi^{3+}$,$Eu^{2+}$; $Y_3Al_5O_{12}$:Ce; $Y_2O_2S$:Eu; ZnS:Cu, Ag; and mixtures thereof.

8. The light source of claim 1, wherein the phosphors further include a third phosphor which is capable of absorbing a part of the light from at least one of the first light emitting component and/or the second light emitting component and emitting light of a fifth wavelength.

9. The light source of claim 1, further including:
a third light emitting component which emits light at a wavelength different from that of the first and second wavelengths.

10. The light source of claim 9, further including:
a phosphor which is capable of absorbing a part of the light from the third light emitting component and emitting light of a wavelength which is different from the that of the light emitted from the third light emitting component.

11. The light source of claim 10, wherein the third phosphor is substantially unaffected by light of the first and second wavelengths.

12. The light source of claim 1, further including:
a housing; and
a reflective coating disposed on an interior surface of the housing, the light emitting components being positioned within the housing.

13. The light source of claim 12, further including a transparent plate which closes an open end of the housing and wherein the phosphors are in the form of a coating on the transparent plate.

14. A light source comprising:
a first light emitting component which emits light at a first wavelength;
a second light emitting component which emits light at a second wavelength different from that of the first wavelength; and
phosphors positioned to receive the light emitted by the first and second light emitting components, the phosphors including:
a first phosphor which absorbs a part of the light from the first light emitting component and emits light of a third wavelength, and
a second phosphor which absorbs a part of the light from the second light emitting component and emits light of a fourth wavelength, the second phosphor being excited relatively less by light of the first wavelength than by light of the second wavelength, the phosphors being dispersed in a medium which contacts and encapsulates the light emitting components.

15. The light source of claim 1, wherein the light emitting components comprise GaN semiconductor materials.

16. The light source of claim 14, wherein the GaN semiconductor materials for each of the light emitting components are formed on a single substrate.

17. The light source of claim 4, wherein the controller includes a rheostat, which variably adjusts the power supplied to one of the first and second light emitting components.

18. The light source of claim 17, wherein the controller includes a switch, which connects the first and second light sources with a source of power.

19. The light source of claim 4, wherein the controller includes a control system which determines the amount of power to be supplied to the first and second light emitting components in accordance with a color of light selected by an operator.

20. A method of changing the color of light comprising:
providing a first light emitting component which emits light of a first wavelength, a second light emitting component which emits light of a second wavelength, a first phosphor which absorbs a part of the light from the first light emitting component and emits light of a longer wavelength, and a second phosphor which absorbs a part of the light from the second light emitting component and emits light of a longer wavelength different from the wavelength of the light emitted by the first phosphor, the second phosphor relatively less affected by light of the first wavelength than by light of the second wavelength;
adjusting power supplied to at least one of the first and second light emitting components separately from the other of the first and second light emitting components such that the amount of light emitted by the at least one of the first and second light emitting components is adjusted; and
combining the light emitted by the first phosphor and the second phosphor.

21. The method of claim 20, wherein the first phosphor is excited by both the first and the second light emitting components.

22. The method of claim 20, wherein the step of adjusting power supplied to at least one of the first and second light emitting components includes separately adjusting power supplied to both the first and second light emitting components.

* * * * *